(12) United States Patent
Xu

(10) Patent No.: US 7,372,384 B1
(45) Date of Patent: May 13, 2008

(54) HIGH-SPEED, HIGH-RESOLUTION, LOW-POWER ANALOG-TO-DIGITAL CONVERTER

(76) Inventor: Bin Xu, 10465 Byrne Ave., Cupertino, CA (US) 95014

( * ) Notice: Subject to any disclaimer, the term of this patent is extended or adjusted under 35 U.S.C. 154(b) by 0 days.

(21) Appl. No.: 11/611,408

(22) Filed: Dec. 15, 2006

(51) Int. Cl.
*H03M 3/00* (2006.01)

(52) U.S. Cl. ........................ 341/143; 341/182; 341/189

(58) Field of Classification Search ................ 341/143, 341/155, 182, 189
See application file for complete search history.

(56) References Cited

U.S. PATENT DOCUMENTS

| | | | | |
|---|---|---|---|---|
| 5,974,089 A | * | 10/1999 | Tripathi et al. | 375/247 |
| 6,249,237 B1 | * | 6/2001 | Prater | 341/143 |
| 6,646,581 B1 | * | 11/2003 | Huang | 341/143 |
| 6,970,123 B1 | * | 11/2005 | Sahandiesfanjani | 341/155 |
| 6,998,910 B2 | * | 2/2006 | Hezar et al. | 330/10 |
| 7,078,964 B2 | * | 7/2006 | Risbo et al. | 330/10 |
| 7,084,799 B1 | * | 8/2006 | Butler | 341/143 |
| 7,200,187 B2 | * | 4/2007 | O'Brien | 375/316 |
| 7,259,618 B2 | * | 8/2007 | Hand et al. | 330/10 |
| 7,262,658 B2 | * | 8/2007 | Ramaswamy et al. | 330/251 |
| 7,301,490 B2 | * | 11/2007 | Butler | 341/143 |
| 7,307,565 B1 | * | 12/2007 | Melanson | 341/143 |

* cited by examiner

*Primary Examiner*—Linh Nguyen
(74) *Attorney, Agent, or Firm*—Gibb & Rahman, LLC; Mohammad S. Rahman, Esq.

(57) ABSTRACT

An ADC and method comprises a hybrid-type sigma-delta modulator comprising a digital delta-stage and an analog sigma-stage, wherein the analog sigma-stage comprises an analog low-pass filter adapted to only pass a low frequency audio band between 0-20 khz of a PWM wave, and wherein the digital delta-stage comprises a PWM wave generator; a pair of MOSFETs; and a power supply unit outputting voltage to the pair of MOSFETs. The ADC comprises a comparator attached to the hybrid-type sigma-delta modulator; a low-pass filter configured in a digital domain and for receiving a signal output of the comparator and remove high-frequency components of the comparator output above the audio band; a PWM back converter adapted to receive the filtered signal output and translate the digital low-pass filtered signal output to a power supply transient value in a digital format; and a dither signal source for injecting a dither signal to the digital delta-stage.

30 Claims, 8 Drawing Sheets

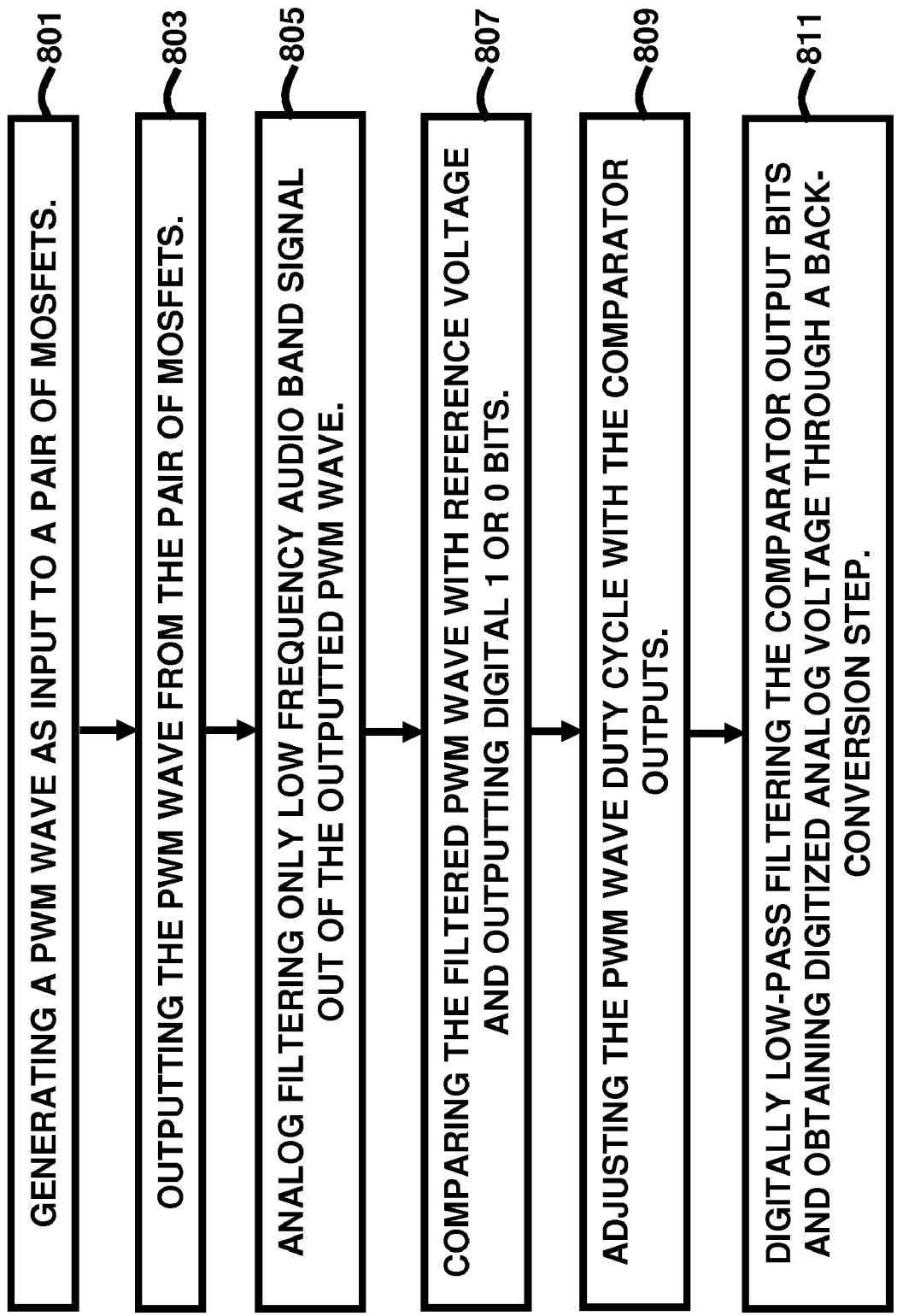

HIGH-SPEED, HIGH-RESOLUTION, LOW-POWER ANALOG-TO-DIGITAL CONVERTER

CROSS REFERENCE TO RELATED APPLICATION

This application relates to co-pending U.S. patent applications entitled "All-Digital Class-D Audio Amplifier with Direct Battery Hook-Up", U.S. patent application Ser. No. 11/611,415, filed Dec. 15, 2006, the contents of which in its entirety is herein incorporated by reference.

BACKGROUND

1. Technical Field

The embodiments herein generally relate to electrical components, and, more particularly, to analog-to-digital converters (ADCs).

2. Description of the Related Art

Class-D is a switching-based audio amplifier technology and theoretically it can achieve approximately 100% power efficiency. Traditional Class-AB audio amplifiers typically have much lower efficiency. FIG. 1 shows a typical power efficiency comparison between a class-D amplifier and a class-AB amplifier. For portable devices such as MP3 players and multi-media cell phones, etc., where the battery power consumption is critical, users are motivated to use more power efficient class-D audio amplifiers to replace the current market-dominant class-AB amplifiers, which only has approximately 20-30% efficiency for portable digital audio applications.

The major technology barrier to overcome in order to make a good quality class-D audio amplifier is to provide a sufficient power supply rejection ratio (PSRR). Class-D uses a pair of metal-oxide-semiconductor field-effect transistor (MOSFET) power transistors, switched on and off by the input pulse-width modulation (PWM) waves, to drive the speaker load, as shown in FIG. 2. If no measure is taken; i.e., PSRR=0 dB, any VCC power rail ripples will directly propagate to output load, thus destroying the signal-to-noise ratio/total harmonic distortion (SNR/THD+N) performance of the audio amplifier. A high-end audio amplifier is usually specified with >90 dB SNR. Considering the power rail noise level is in the order of 10 mV (−40 dB), a PSRR of approximately 50 dB generally must be provided in order to deliver 40 dB+50 dB 90 dB SNR.

Currently, the commercially available class-D amplifiers are generally all analog-type as shown in FIG. 3. The PSRR is provided by the analog feedback loop which corrects the distortion on the analog output by comparing it with the ideal analog input signal through a feedback loop filter. Typically, these analog class-D audio amplifiers can only work in high-power (>10 W) applications such as home theatres and flat panel televisions with good power efficiencies (approximately 90%). For low-power portable device applications, where the audio output power is typically in the range of 10-100 mW, the analog class-D power efficiency drops to <30% due to overhead analog circuitry of analog class-D; i.e., the feedback loop and an external digital-to-analog converter (DAC) to convert the digital input into analog input. Currently, for portable digital audio applications, there are no suitable commercial class-D audio amplifiers which can deliver high power efficiency.

Besides the analog approach, there is a digital approach to provide PSRR for class-D; i.e., digitalizing the power supply ripple and then using digital signal processing techniques to correct output distortions caused by power supply ripple. To make this approach work for class-D audio amplifiers for portable applications, a high-speed, low-power consumption, and high-resolution ADC needs to be provided in order to digitize the voltage ripples on power supply. Because digital circuits consume much lower power, such digital class-D devices can deliver much higher power efficiency for portable applications.

Conventional ADCs for audio applications use analog sigma-delta modulators based on either switched-capacitor integrator circuits or continuous-time integrator circuits that consume relatively high power. Therefore, the conventional ADCs cannot be used for building a digital class-D audio amplifier with a suitable PSRR performance for portable applications.

As such, those skilled in the art would readily acknowledge that there remains a need for a novel type of ADC which has low-power consumption and high speed in order to build a power-efficient class-D audio amplifier with sufficient PSRR performance.

SUMMARY

In view of the foregoing, an embodiment herein provides an ADC comprising a hybrid-type sigma-delta modulator comprising a digital delta-stage and an analog sigma-stage, wherein the analog sigma-stage comprises an analog low-pass filter adapted to only pass a low frequency audio band between approximately 0-20 khz of a PWM wave, and wherein the digital delta-stage comprises a PWM wave generator; a pair of MOSFETs driven by a PWM wave derived from the PWM wave generator; and a power supply unit outputting voltage to the pair of MOSFETs. The ADC further comprises a comparator attached to the hybrid-type sigma-delta modulator; a low-pass filter configured in a digital domain and adapted to receive a signal output of the comparator and remove high-frequency components of the comparator output above the audio band; a PWM back converter adapted to receive the filtered signal output and translate the digital low-pass filtered signal output to a power supply transient value in a digital format; and a dither signal source adapted to inject a dither signal to the digital delta-stage.

Moreover, the analog low-pass filter may comprise any of an active RC filter, an active RLC filter, an active LC filter, and a passive low-pass filter comprising any of a RC circuit, a LC circuit, and a RLC circuit, and wherein the analog low-pass filter comprises a cut-off frequency above the audio band. Preferably, the analog low-pass filter is adapted to function as the sigma-stage of the hybrid-type sigma-delta modulator integrating the PWM wave generated by the PWM generator. Furthermore, the comparator is preferably adapted to compare an output of the analog low-pass filter with a static reference voltage, wherein the comparator is adapted to (i) output a "1", wherein the "1" comprises a digital 1 representation, if the analog low-pass filter output is greater than the static reference voltage, and (ii) output a "−1", wherein the "−1" comprises a digital 0 representation, if the analog low-pass output is less than the static reference voltage.

Also, in the digital delta-stage, a duty cycle of the PWM wave may adjust with the comparator output, wherein the duty cycle decreases if the comparator outputs the digital 1 representation, and increases if the comparator outputs the digital 0 representation. Additionally, the low-pass filter in the digital domain may comprise any of a finite impulse response filter and an infinite impulse response filter, wherein the low-pass digital filter is adapted to filter the comparator output, and wherein the output of the low-pass digital filter gives a digitized value of a power supply voltage through the back converter. Preferably, the comparator operates with a sampling frequency in a range of approximately 200 khz to 100 Mhz. Moreover, a switching frequency of the PWM wave is preferably in a range of approximately 200 khz to 100 Mhz.

Preferably, the hybrid-type sigma-delta modulator, the comparator, the low-pass filter configured in the digital domain, and the PWM back converter are arranged in a portable battery-powered multi-media device to digitize analog signals. Furthermore, the digital delta-stage may comprise a three-input digital adder circuit adapted to receive the dither signal, and wherein the dither signal comprises a digital signal having an approximately zero frequency component in the audio band. Additionally, the three-input digital adder is preferably adapted to (i) subtract the comparator output from a static reference voltage value, and (ii) add the dither signal.

Moreover, an output of the three-input adder is preferably an input of the PWM generator, and is adapted to determine a duty cycle of the PWM wave, and wherein the PWM wave is an output of the PWM generator and is an input of the analog low-pass filter. Also, the portable battery-powered multi-media device may comprise an all-digital class-D audio amplifier achieving audio resolution in range of 10 bit-20 bit. Preferably, the all-digital class-D audio amplifier achieves a PSRR in a range of 20 dB-80 dB. Furthermore, the all-digital class-D audio amplifier may achieve a power efficiency of at least approximately 90% for low-power battery-operated portable digital audio applications in an approximate range of 10 mW-100 mW.

Another embodiment provides an all-digital class-D audio amplifier comprising a hybrid-type sigma-delta modulator comprising a digital delta-stage and an analog sigma-stage, wherein the analog sigma-stage comprises an analog low-pass filter adapted to only pass a low frequency audio band between approximately 0-20 khz of a PWM wave, and wherein the digital delta-stage comprises a PWM wave generator; a pair of MOSFETs driven by a PWM wave derived from the PWM wave generator; and a power supply unit outputting voltage to the pair of MOSFETs. The all-digital class-D audio amplifier further comprises a comparator attached to the hybrid-type sigma-delta modulator; a low-pass filter configured in a digital domain and adapted to receive a signal output of the comparator and remove high-frequency components of the comparator output above the audio band; a PWM back converter adapted to receive the filtered signal output and translate the digital low-pass filtered signal output to a power supply transient value in a digital format; and a dither signal source adapted to inject a dither signal to the digital delta-stage, wherein the all-digital class-D audio amplifier achieves a PSRR in a range of 20 dB-80 dB.

Moreover, the analog low-pass filter may comprise any of an active RC filter, an active RLC filter, an active LC filter, and a passive low-pass filter comprising any of a RC circuit, a LC circuit, and a RLC circuit, and wherein the analog low-pass filter comprises a cut-off frequency above the audio band. Furthermore, the analog low-pass filter may be adapted to function as the sigma-stage of the hybrid-type sigma-delta modulator integrating the PWM wave generated by the PWM generator. Furthermore, the comparator may be adapted to compare an output of the analog low-pass filter with a static reference voltage, wherein the comparator is adapted to (i) output a "1", wherein the "1" comprises a digital 1 representation, if the analog low-pass filter output is greater than the static reference voltage, and (ii) output a "−1", wherein the "−1" comprises a digital 0 representation, if the analog low-pass output is less than the static reference voltage.

Furthermore, the digital delta-stage, a duty cycle of the PWM wave may adjust with the comparator output, wherein the duty cycle decreases if the comparator outputs the digital 1 representation, and increases if the comparator outputs the digital 0 representation. Moreover, the low-pass filter in the digital domain may comprise any of a finite impulse response filter and an infinite impulse response filter, wherein the low-pass digital filter is adapted to filter the comparator output, and wherein the output of the low-pass digital filter gives a digitized value of a power supply voltage through the back converter. Preferably, the comparator operates with a sampling frequency in a range of approximately 200 khz to 100 Mhz. Additionally, a switching frequency of the PWM wave is preferably in a range of approximately 200 khz to 100 Mhz.

Also, the hybrid-type sigma-delta modulator, the comparator, the low-pass filter configured in the digital domain, and the PWM back converter may be arranged in a portable battery-powered multi-media device to digitize analog signals. Furthermore, the digital delta-stage may comprise a three-input digital adder circuit adapted to receive the dither signal, and wherein the dither signal comprises a digital signal having an approximately zero frequency component in the audio band. Moreover, the three-input digital adder may be adapted to (i) subtract the comparator output from a static reference voltage value, and (ii) add the dither signal.

Also, an output of the three-input adder is preferably an input of the PWM generator, and is adapted to determine a duty cycle of the PWM wave, and wherein the PWM wave is an output of the PWM generator and is an input of the analog low-pass filter. Preferably, the portable battery-powered multi-media device achieves audio resolution in a range of 10 bit-20 bit. Also, the all-digital class-D audio amplifier may further comprise a power efficiency of at least approximately 90% for low-power battery-operated portable digital audio applications in an approximate range of 10 mW-100 mW.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 8 is a flow diagram illustrating a preferred method according to an embodiment herein.

DETAILED DESCRIPTION OF PREFERRED EMBODIMENTS

Figure 1:
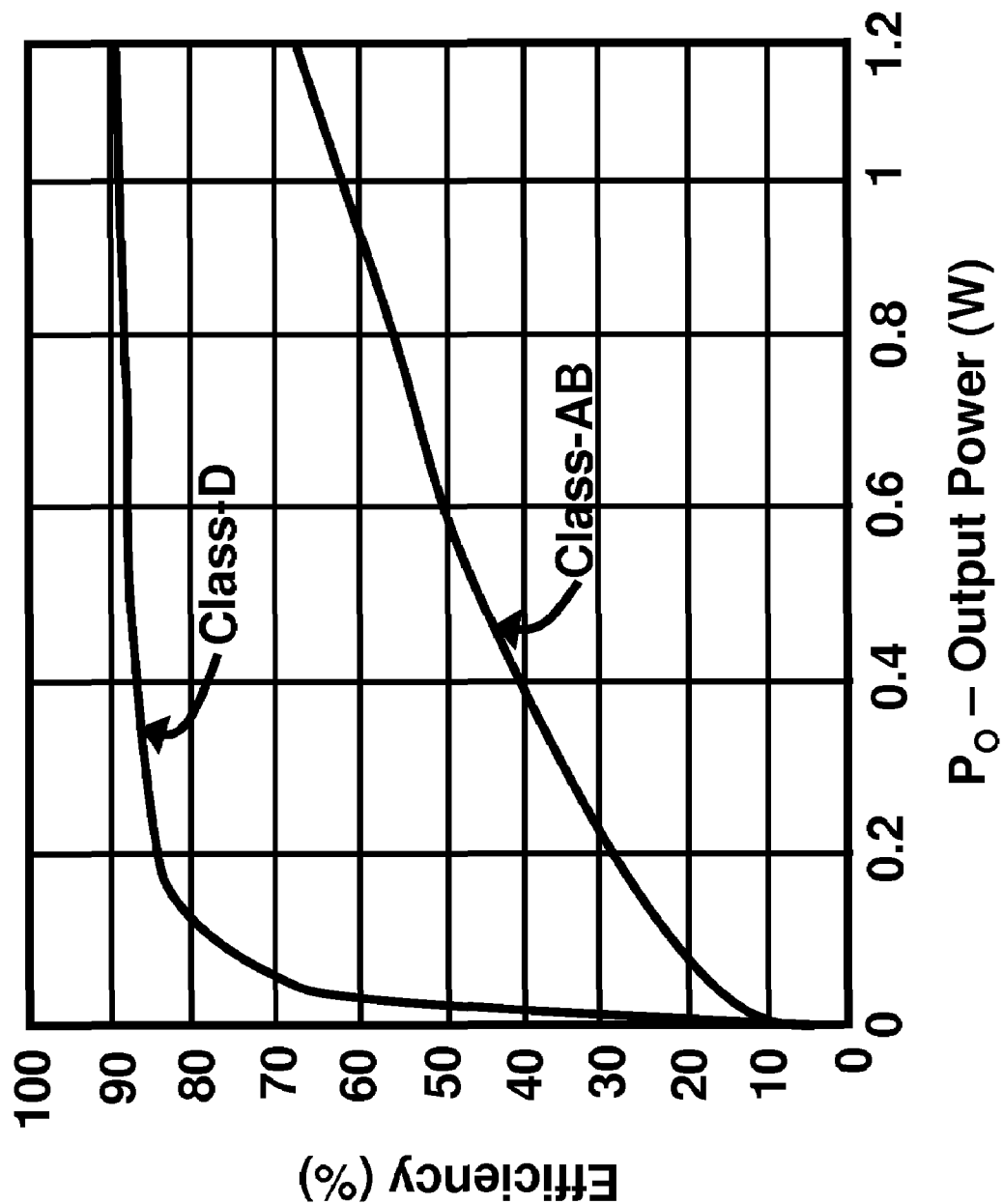
FIG. 1 is a graphical representation illustrating a typical power efficiency comparison between a class-D amplifier and a class-AB amplifier.
Figure 2:
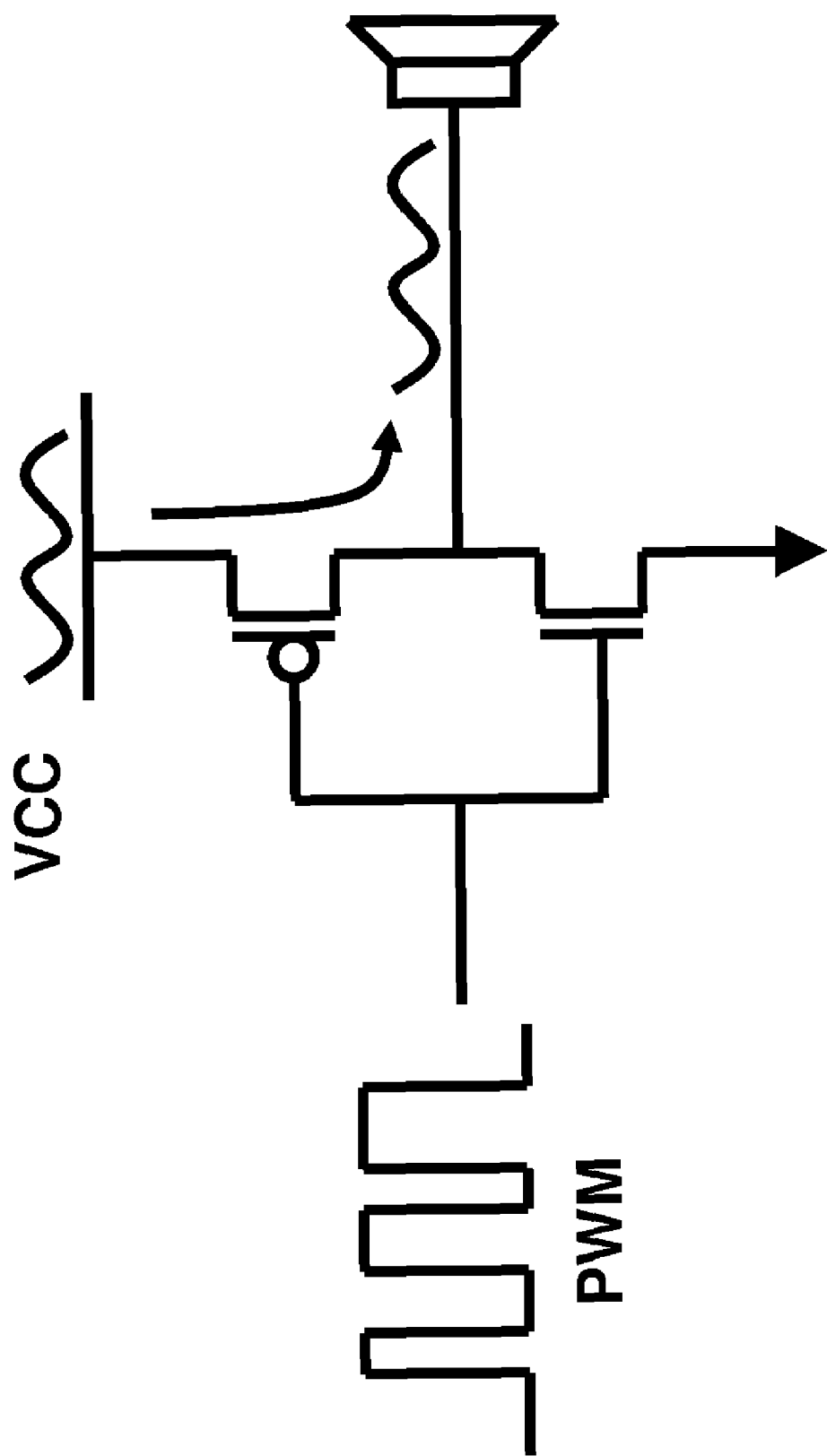
FIG. 2 illustrates a schematic electrical diagram of a class-D amplifier.
Figure 3:
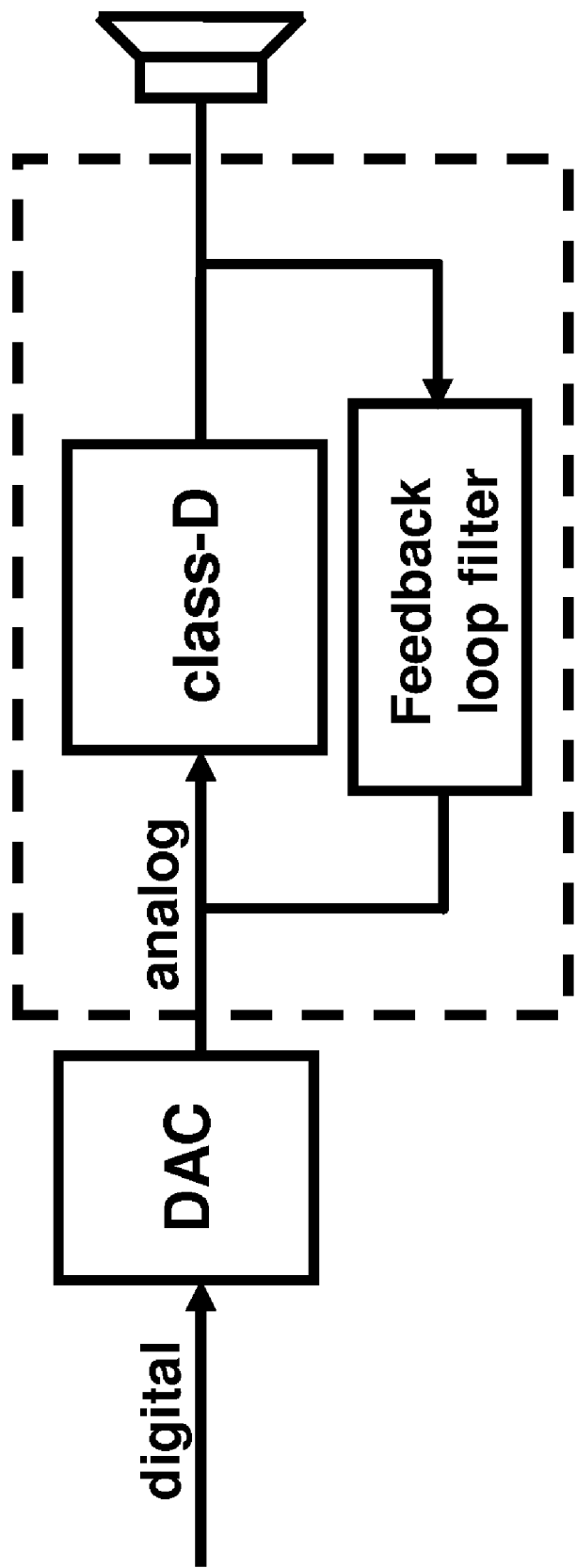
FIG. 3 illustrates a schematic block diagram of an analog class-D amplifier.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a low-power consumption and high speed ADC in order to digitize the power supply ripple, and then in turn to provide PSRR performance for an all-digital class-D audio amplifier. The embodiments herein achieve this by providing a novel high-speed, high-resolution, low-power hybrid sigma-delta analog-to-digital converter having a PSRR in the range of 20 dB-80 dB. Referring now to the drawings, and more particularly to FIGS. 4 through 8, where similar reference characters denote corresponding features consistently throughout the figures, there are shown preferred embodiments.

Figure 4:
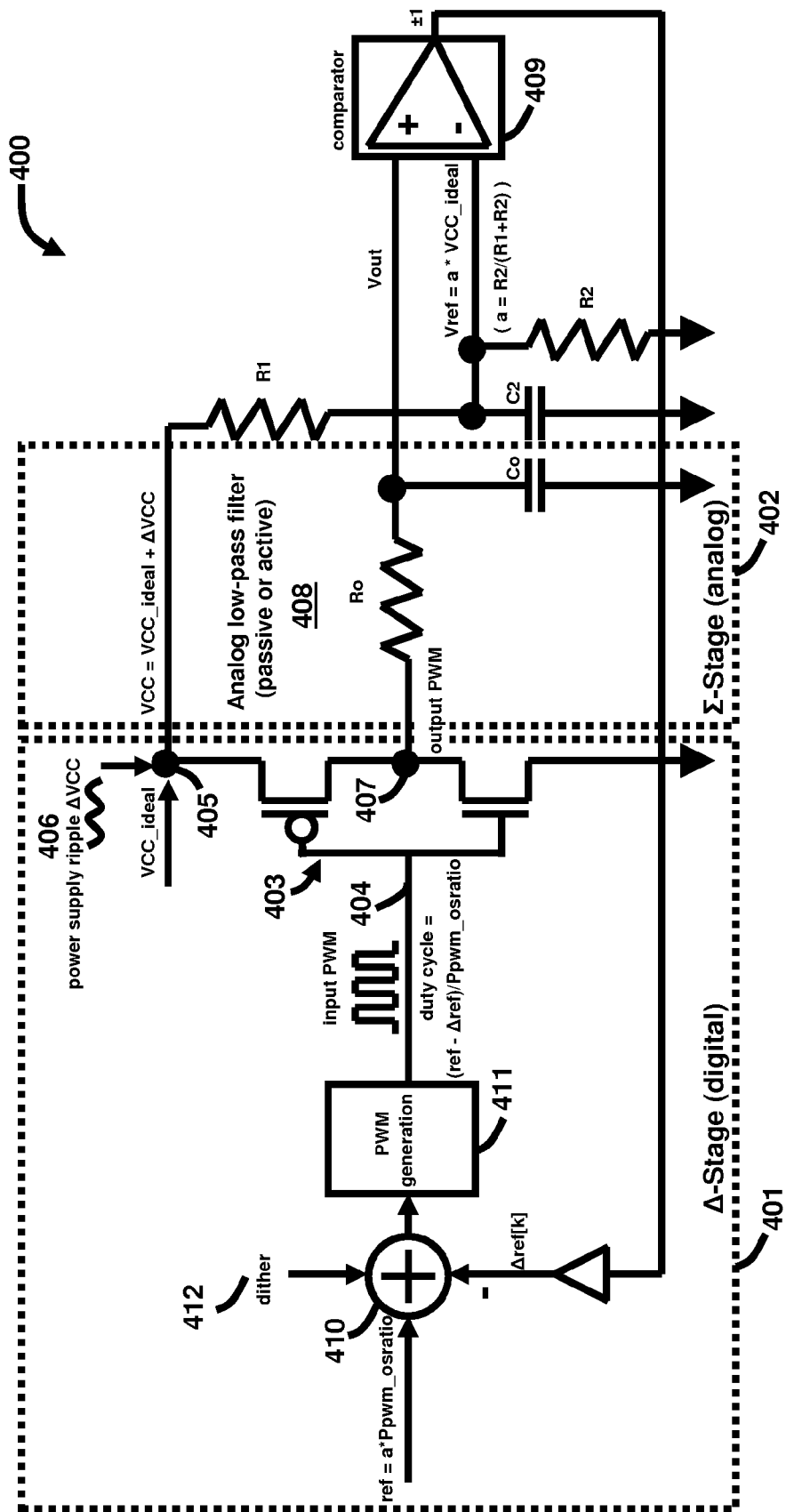
FIG. 4 illustrates a schematic block diagram of a hybrid sigma-delta analog-to-digital converter according to an embodiment herein.

FIG. 4 illustrates a novel ADC 400 according to an embodiment herein, wherein the ADC 400 digitizes the power supply noise or transient in real time with high resolution. The ADC 400 comprises a hybrid-type sigma-delta modulator; i.e., the delta-stage 401 is digital, and the sigma-stage is analog 402. The operation of the ADC 400 is as follows. A MOSFET pair 403 is driven by a PWM input 404 from a PWM generator 411, and the VCC 405 of the MOSFET pair is connected to the power supply 406 to be digitized. The PWM switching frequency is $f_{Ppwm}$, and the phase locked loop (PLL) frequency for this PWM waveform 404 is $f_{Ppll}$. The PWM oversampling ratio is $P_{PWM\_OSRATIO}=f_{Ppll}/f_{Ppwm}$ and usually it is an integer of 2's power. The PWM waveform's time-domain granularity is $1/f_{Ppll}$.

The input PWM 404 is determined by its duty cycle a, and "ref=a*$P_{PWM\_OSRATIO}$" is the duration when PWM stays up during a PWM switching period. The "a" is a constant between 0 and 1, "0<a<1". If there are no power supply ripples, the output PWM 407, after the analog low-pass filter 408 which has a cutoff frequency around 20 khz to only pass the low frequency audio band (approximately 0-20 khz), will give a DC voltage level at Vout=a*VCC. This occurs because the DC voltage is equivalent to averaging the PWM waveform. The average of PWM waveform is determined by the duty cycle a; i.e., Vout=a*VCC. The analog low-pass filter 408 can be a passive low-pass filter comprising either a RC circuit, or a LC circuit, or a RLC circuit; or it can be an active RC filter with the same cut-off frequency of audio band upper limit, i.e., 20 khz. The Vref is a reference voltage which is voltage-divided from power supply VCC. The Vref=R2/(R1+R2)*VCC, with the resistance values satisfying a=R2/(R1+R2).

The capacitor C2 works with resistor R1 to make up a low-pass RC filter, which filters out any ripples or transients on power supply VCC and therefore makes Vref static. Thus, it is required that R1*C2 is a big value; e.g., R1*C2≈0.1 second. With the presence of power supply ripples ΔVCC, the power supply voltage is VCC=VCC_ideal+ΔVCC. The Vref equals to Vref=a*VCC_ideal with ΔVCC filtered out by R1*C2 filter. A comparator 409 compares the value of Vout and Vref at each clock cycle of $f_{Ppwm}$. The comparator 409 outputs +1 (digital 1) if Vout>Vref, and outputs −1 (digital 0) if Vout<Vref.

Figure 5:
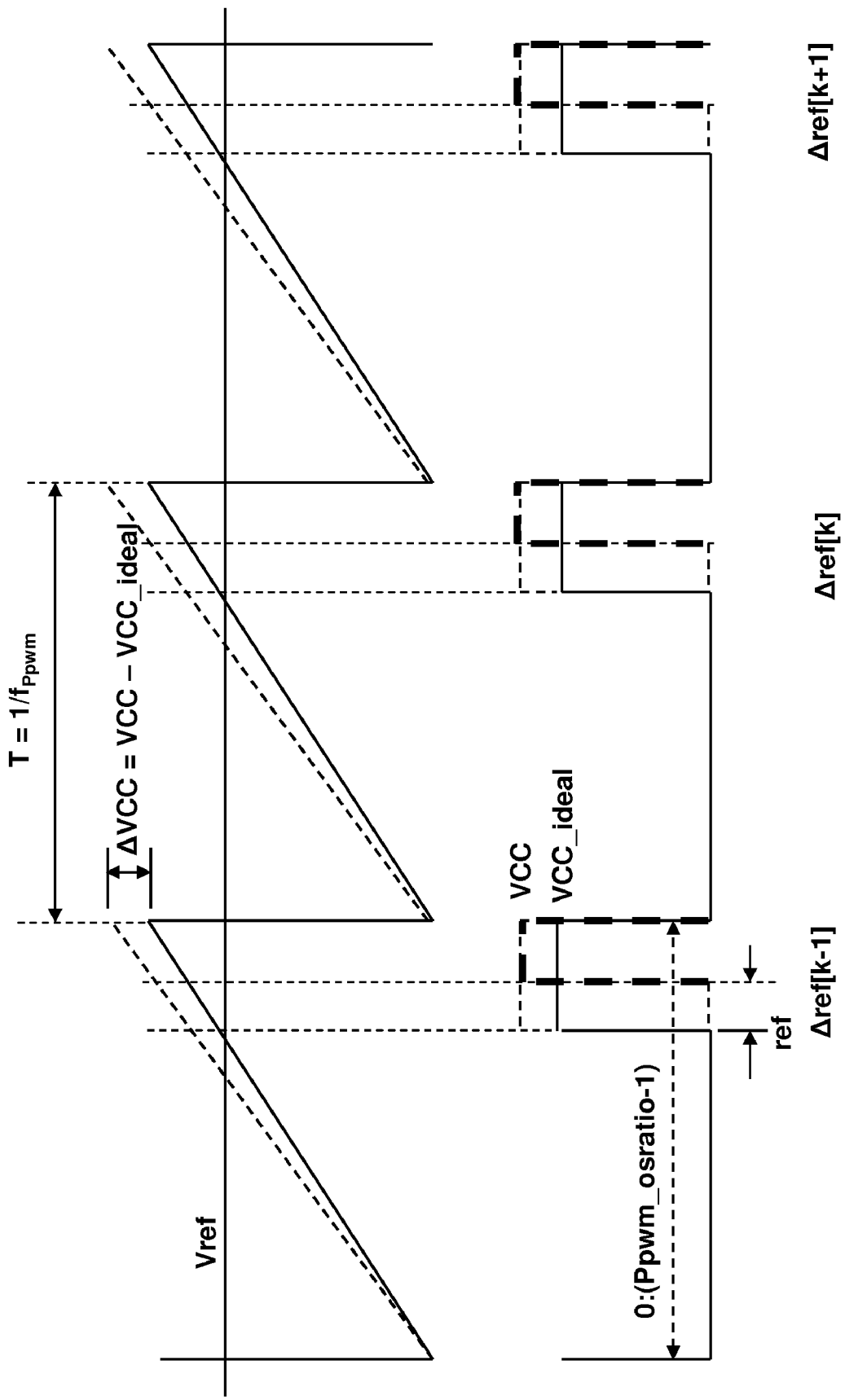
FIG. 5 is a graphical representation illustrating the relation between PWM waveform shift and power supply transient.

When there is a power supply transient, for example, ΔVCC>0, shown in FIG. 5, the output PWM 407 (of FIG. 4), after the analog low-pass filter 408 (of FIG. 4), will yield a higher Vout value thus causing the comparator 409 (of FIG. 4) to give +1 value. The comparator value, sampled at the clock cycle of $f_{Ppwm}$, is fed back to an adder circuit 410, which provides input to the PWM generation 411 to generate input PWM waveform 404. The adder circuit 410 is subtracting the value ref with Δref, or equivalently to say, ref is adjusted from "a*$P_{PWM\_OSRATIO}$" to "a*$P_{PWM\_OSRATIO}$−Δref". The duty cycle of the input PWM 404 thus decreases, bringing down the Vout value. If the Vout value is below Vref, then the comparator output bit is flipped so that duty cycle of the PWM will increase to bring up the Vout value.

The above approach works according to the same principle of a sigma-delta modulator. Here, the sigma-stage 402 is the analog low-pass filter functioning as an integrator. The delta-stage 401 is in the digital domain which subtracts the comparator output value from the input. Thus, FIG. 4 presents a PWM-based first-order sigma-delta modulator of hybrid-type.

To remove the idle tones often seen in lower-order sigma-delta modulators, a dither signal 412 is added to the delta-stage in the digital domain through the three-input adder circuit 410. The adder circuit output is (ref−Δref+dither). The dither signal 412 is any digital signal which has a zero (or a very small) frequency component in the audio band (approximately 0-20 khz) to avoid adding any extra noise to the audio band of the ADC 400.

Figure 6:
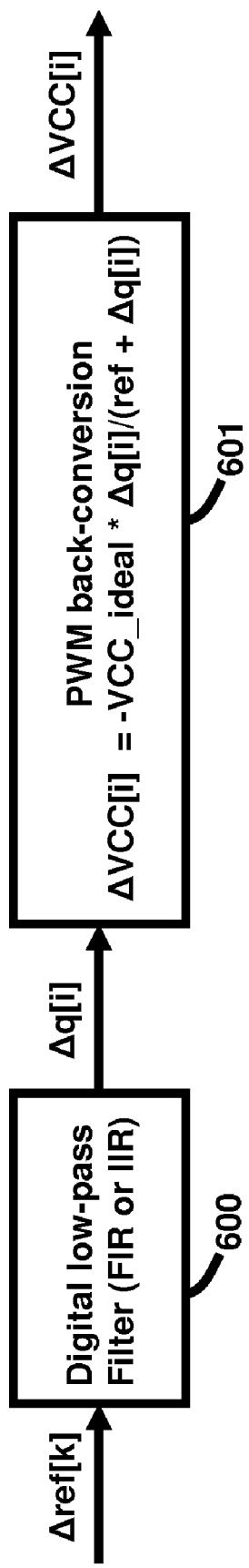
FIG. 6 illustrates a schematic block diagram for a PWM back-conversion process according to an embodiment herein.

As shown in FIG. 6, the output of this hybrid-type sigma-delta modulator, Δref[k], is then low-passed filtered in a digital domain using a finite impulse response (FIR) filter or an infinite impulse response (IIR) filter 600 to remove high-frequency components above the audio band. This filtered sequence, q[i], is translated to the power supply transient value, ΔVCC[i], through the PWM back-conversion process 601: ΔVCC[i]=−VCC_ideal*Δq[i]/(ref+Δq[i]).

In order to obtain a high SNR for this hybrid sigma-delta ADC 400 (of FIG. 4), the sampling frequency $f_{Ppwm}$ is preferably set sufficiently high, for example, in the range of approximately 200 khz to 100 Mhz. The comparator 409 (of FIG. 4) is preferably high-speed which can operate in the range of 200 khz to 100 Mhz with a gain typically in the range of approximately 60-80 dB.

Figure 7:
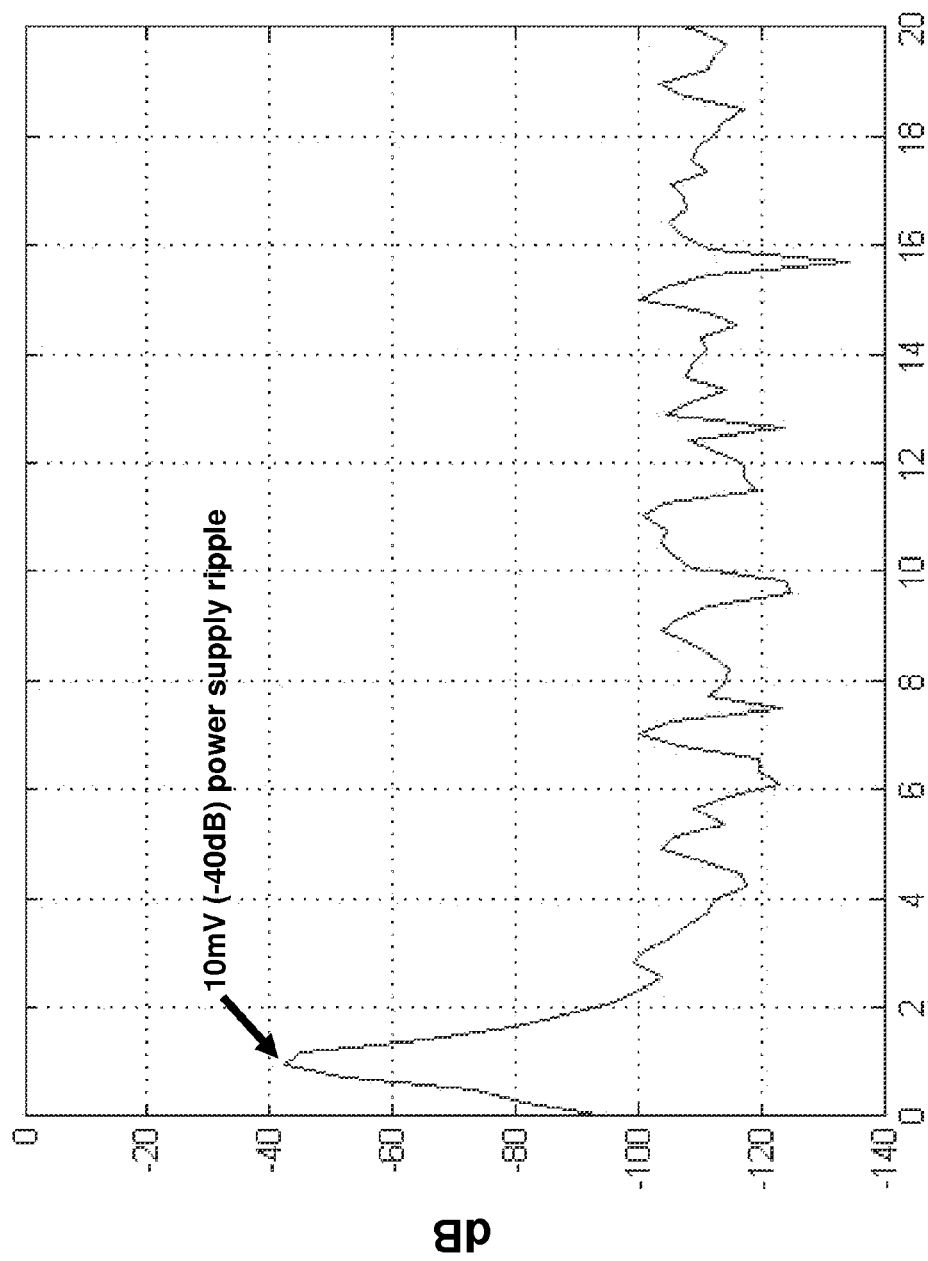
FIG. 7 is a graphical representation illustrating the spectrum of digitized power supply according to an embodiment herein.

FIG. 7 illustrates the spectrum of the power supply ripples digitized by the hybrid sigma-delta ADC 400 (of FIG. 4). The integrated noise floor (NF) is below approximately 102 dB which gives an approximately 17-bit resolution in the audio band for this ADC 400. In other words, a 17-bit resolution=102 dB divided by 6 dB/bit. Because the hybrid ADC 400 does not use the analog-type sigma-delta modulators seen in traditional switched-capacitor sigma-delta modulators or continuous-time sigma-delta modulators, the power consumption for its operation is relatively low, typically in the 1-10 mW range. Due to its capability of high-speed operation, the ADC 400 can achieve real-time digitization with high solution of the power supply ripples.

FIG. 8, with reference to FIGS. 4 through 7, is a flow diagram illustrating a method of digitizing an analog signal according to an embodiment herein, wherein the method comprises generating a PWM wave and inputting (801) the PWM wave into a pair of MOSFETs 403; outputting (803) the PWM wave from the MOSFETs 403; analog filtering (805) only a low frequency audio band signal output between approximately 0-20 khz of the outputted PWM wave; comparing (807) the filtered signal output to a power supply transient value and outputting digital 1 or 0 bits; adjusting (809) the PWM wave duty cycle with the comparator outputs; and digitally filtering (811) the comparator output bits and obtaining digitized analog voltage through a back-conversion step. The method may further comprise attaining a power efficiency of greater than 90% for low-power portable digital audio applications utilizing the method in an approximate range of 10-100 mW. Moreover, the method may further comprise utilizing a sampling frequency of approximately 200 kKhz to 100 Mhz. In one application, the method may further comprise incorporating the method in a portable battery-powered multi-media device such as an MP3 player. Preferably, the portable battery-powered multi-media device comprises an all-digital class-D audio amplifier achieving a 10 bit-20 bit audio resolution.

The techniques provided by the embodiments herein can also be employed to build a general purpose ADC to digitize any forms of analog signals, for audio or non-audio related applications. Examples are: audio ADC to digitize audio or voice; low-power ADC to digitize analog signals from temperature sensors, speed sensors, sound sensors, pressure sensors, capacity sensors, radio frequency electromagnetic wave sensors, analog voltage sensors, and analog current sensors, etc.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

The techniques provided by the embodiments herein may also be implemented on printed circuit board (PCB) using discrete components. In this case, the electronic circuit components described herein, such as adder circuit, digital IIR or FIR circuit, comparator circuit, MOSFET pair, analog low-pass filter, can use discrete components and these discrete components are electronically connected on the printed circuit board to perform the functions of the ADC 400 described herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An analog-to-digital converter (ADC) comprising:
   a hybrid-type sigma-delta modulator comprising a digital delta-stage and an analog sigma-stage, wherein said analog sigma-stage comprises an analog low-pass filter adapted to only pass a low frequency audio band between approximately 0-20 khz of a pulse-width modulation (PWM) wave, and wherein said digital delta-stage comprises:
      a PWM wave generator;
      a pair of metal-oxide-semiconductor field-effect transistors (MOSFETs) driven by a PWM wave derived from said PWM wave generator; and
      a power supply unit outputting voltage to said pair of MOSFETs;
   a comparator attached to said hybrid-type sigma-delta modulator;
   a low-pass filter configured in a digital domain and adapted to receive a signal output of said comparator and remove high-frequency components of the comparator output above said audio band;
   a PWM back converter adapted to receive the filtered signal output and translate the digital low-pass filtered signal output to a power supply transient value in a digital format; and
   a dither signal source adapted to inject a dither signal to said digital delta-stage.

2. The ADC of claim 1, wherein said analog low-pass filter comprises any of an active RC filter, an active RLC filter, an active LC filter, and a passive low-pass filter comprising any of a RC circuit, a LC circuit, and a RLC circuit, and wherein said analog low-pass filter comprises a cut-off frequency above said audio band.

3. The ADC of claim 1, wherein said analog low-pass filter is adapted to function as the sigma-stage of said hybrid-type sigma-delta modulator integrating said PWM wave generated by said PWM generator.

4. The ADC of claim 1, wherein said comparator is adapted to compare an output of said analog low-pass filter with a static reference voltage, wherein said comparator is adapted to (i) output a "1", wherein said "1" comprises a digital 1 representation, if the analog low-pass filter output is greater than said static reference voltage, and (ii) output a "−1", wherein said "−1" comprises a digital 0 representation, if said analog low-pass output is less than said static reference voltage.

5. The ADC of claim 4, wherein in said digital delta-stage, a duty cycle of said PWM wave adjusts with said comparator output, wherein said duty cycle decreases if said comparator outputs the digital 1 representation, and increases if said comparator outputs the digital 0 representation.

6. The ADC of claim 1, wherein said low-pass filter in said digital domain comprises any of a finite impulse response filter and an infinite impulse response filter, wherein said low-pass digital filter is adapted to filter said comparator output, and wherein the output of said low-pass digital filter gives a digitized value of a power supply voltage through said back converter.

7. The ADC of claim 1, wherein said comparator operates with a sampling frequency in a range of approximately 200 khz to 100 Mhz.

8. The ADC of claim 1, wherein a switching frequency of said PWM wave is in a range of approximately 200 khz to 100 Mhz.

9. The ADC of claim 1, wherein said hybrid-type sigma-delta modulator, said comparator, said low-pass filter configured in said digital domain, and said PWM back converter are arranged in a portable battery-powered multi-media device to digitize analog signals.

10. The ADC of claim 1, wherein said digital delta-stage comprises a three-input digital adder circuit adapted to receive said dither signal, and wherein said dither signal comprises a digital signal having an approximately zero frequency component in said audio band.

11. The ADC of claim 10, wherein said three-input digital adder is adapted to (i) subtract said comparator output from a static reference voltage value, and (ii) add said dither signal.

12. The ADC of claim 11, wherein an output of said three-input adder is an input of said PWM generator, and is adapted to determine a duty cycle of said PWM wave, and wherein said PWM wave is an output of said PWM generator and is an input of said analog low-pass filter.

13. The ADC of claim 9, wherein said portable battery-powered multi-media device comprises an all-digital class-D audio amplifier achieving audio resolution in range of 10 bit-20 bit.

14. The ADC of claim 13, wherein said all-digital class-D audio amplifier achieves a power supply rejection ratio (PSRR) in a range of 20 dB-80 dB.

15. The ADC of claim 13, wherein said all-digital class-D audio amplifier achieves a power efficiency of at least approximately 90% for low-power battery-operated portable digital audio applications in an approximate range of 10 mW-100 mW.

16. An all-digital class-D audio amplifier comprising:
a hybrid-type sigma-delta modulator comprising a digital delta-stage and an analog sigma-stage, wherein said analog sigma-stage comprises an analog low-pass filter adapted to only pass a low frequency audio band between approximately 0-20 khz of a pulse-width modulation (PWM) wave, and wherein said digital delta-stage comprises:
a PWM wave generator;
a pair of metal-oxide-semiconductor field-effect transistors (MOSFETs) driven by a PWM wave derived from said PWM wave generator; and
a power supply unit outputting voltage to said pair of MOSFETs;
a comparator attached to said hybrid-type sigma-delta modulator;
a low-pass filter configured in a digital domain and adapted to receive a signal output of said comparator and remove high-frequency components of the comparator output above said audio band;
a PWM back converter adapted to receive the filtered signal output and translate the digital low-pass filtered signal output to a power supply transient value in a digital format; and
a dither signal source adapted to inject a dither signal to said digital delta-stage,
wherein said all-digital class-D audio amplifier achieves a power supply rejection ratio (PSRR) in a range of 20 dB-80 dB.

17. The all-digital class-D audio amplifier of claim 16, wherein said analog low-pass filter comprises any of an active RC filter, an active RLC filter, an active LC filter, and a passive low-pass filter comprising any of a RC circuit, a LC circuit, and a RLC circuit, and wherein said analog low-pass filter comprises a cut-off frequency above said audio band.

18. The all-digital class-D audio amplifier of claim 16, wherein said analog low-pass filter is adapted to function as the sigma-stage of said hybrid-type sigma-delta modulator integrating said PWM wave generated by said PWM generator.

19. The all-digital class-D audio amplifier of claim 16, wherein said comparator is adapted to compare an output of said analog low-pass filter with a static reference voltage, wherein said comparator is adapted to (i) output a "1", wherein said "1" comprises a digital 1 representation, if the analog low-pass filter output is greater than said static reference voltage, and (ii) output a "−1", wherein said "−1" comprises a digital 0 representation, if said analog low-pass output is less than said static reference voltage.

20. The all-digital class-D audio amplifier of claim 19, wherein in said digital delta-stage, a duty cycle of said PWM wave adjusts with said comparator output, wherein said duty cycle decreases if said comparator outputs the digital 1 representation, and increases if said comparator outputs the digital 0 representation.

21. The all-digital class-D audio amplifier of claim 16, wherein said low-pass filter in said digital domain comprises any of a finite impulse response filter and an infinite impulse response filter, wherein said low-pass digital filter is adapted to filter said comparator output, and wherein the output of said low-pass digital filter gives a digitized value of a power supply voltage through said back converter.

22. The all-digital class-D audio amplifier of claim 16, wherein said comparator operates with a sampling frequency in a range of approximately 200 khz to 100 Mhz.

23. The all-digital class-D audio amplifier of claim 16, wherein a switching frequency of said PWM wave is in a range of approximately 200 khz to 100 Mhz.

24. The all-digital class-D audio amplifier of claim 16, wherein said hybrid-type sigma-delta modulator, said comparator, said low-pass filter configured in said digital domain, and said PWM back converter are arranged in a portable battery-powered multi-media device to digitize analog signals.

25. The all-digital class-D audio amplifier of claim 16, wherein said digital delta-stage comprises a three-input digital adder circuit adapted to receive said dither signal, and wherein said dither signal comprises a digital signal having an approximately zero frequency component in said audio band.

26. The all-digital class-D audio amplifier of claim 25, wherein said three-input digital adder is adapted to (i) subtract said comparator output from a static reference voltage value, and (ii) add said dither signal.

27. The all-digital class-D audio amplifier of claim 26, wherein an output of said three-input adder is an input of said PWM generator, and is adapted to determine a duty cycle of said PWM wave, and wherein said PWM wave is an output of said PWM generator and is an input of said analog low-pass filter.

28. The all-digital class-D audio amplifier of claim 24, wherein said portable battery-powered multi-media device achieves audio resolution in a range of 10 bit-20 bit.

29. The all-digital class-D audio amplifier of claim 24, further comprising a power efficiency of at least approximately 90% for low-power battery-operated portable digital audio applications in an approximate range of 10 mW-100 mW.

30. A method of digitizing a signal, said method comprising:

generating a pulse-width modulation (PWM) wave as an input to a pair of metal-oxide-semiconductor field-effect transistors (MOSFETs);

outputting said PWM wave from said pair of MOSFETs;

analog filtering only a low frequency audio band signal out of the outputted PWM wave;

comparing the filtered PWM wave with a reference voltage and outputting digital 1 or 0 bits;

adjusting a PWM wave duty cycle with the compared outputs; and digitally low-pass filtering the compared outputs bits and obtaining a digitized analog voltage through a back-conversion process.

* * * * *